(12) United States Patent
Kim et al.

(10) Patent No.: US 10,510,759 B2
(45) Date of Patent: Dec. 17, 2019

(54) SEMICONDUCTOR MEMORY DEVICE

(71) Applicant: SAMSUNG ELECTRONICS CO., LTD., Suwon-si, Gyeonggi-do (KR)

(72) Inventors: Hui-jung Kim, Seongnam-si (KR); Bong-soo Kim, Yongin-si (KR); Sung-hee Han, Hwaseong-si (KR); Yoo-sang Hwang, Suwon-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 9 days.

(21) Appl. No.: 16/004,937

(22) Filed: Jun. 11, 2018

(65) Prior Publication Data

US 2019/0164976 A1 May 30, 2019

(30) Foreign Application Priority Data

Nov. 28, 2017 (KR) ........................ 10-2017-0161000

(51) Int. Cl.
*H01L 27/108* (2006.01)
*H01L 21/768* (2006.01)
*H01L 49/02* (2006.01)
*H01L 21/321* (2006.01)
*H01L 21/02* (2006.01)
*H01L 21/311* (2006.01)

(52) U.S. Cl.
CPC .. *H01L 27/10814* (2013.01); *H01L 21/76802* (2013.01); *H01L 21/76877* (2013.01); *H01L 27/10817* (2013.01); *H01L 27/10823* (2013.01); *H01L 27/10855* (2013.01); *H01L 28/90* (2013.01); *H01L 21/0217* (2013.01); *H01L 21/02274* (2013.01); *H01L 21/31111* (2013.01); *H01L 21/3212* (2013.01); *H01L 27/10876* (2013.01)

(58) Field of Classification Search
CPC ............ H01L 45/1253; H01L 45/1616; H01L 45/149; H01L 28/40–92; H01L 27/10805–10841; H01L 27/1085–1087
See application file for complete search history.

(56) References Cited

U.S. PATENT DOCUMENTS

| | | |
|---|---|---|
| 8,669,181 B1 | 3/2014 | Yu et al. |
| 2002/0076918 A1* | 6/2002 | Han ................. H01L 21/76807 438/634 |

(Continued)

FOREIGN PATENT DOCUMENTS

| | | |
|---|---|---|
| KR | 1020070002783 | 1/2007 |
| KR | 100865726 | 10/2008 |
| KR | 1020080087268 | 10/2008 |

*Primary Examiner* — Tucker J Wright
*Assistant Examiner* — Wilner Jean Baptiste
(74) *Attorney, Agent, or Firm* — F. Chau & Associates, LLC

(57) ABSTRACT

A semiconductor memory device according to an example embodiment of the present inventive concept may include: a plurality of lower electrodes located on a substrate and spaced apart from one another; and an etch stop pattern located on the substrate and surrounding at least a part of each of the plurality of lower electrodes, in which the etch stop pattern includes: a first etch stop pattern including carbon; and a second etch stop pattern located on the first etch stop pattern and including a material different from a material of the first etch stop pattern.

16 Claims, 15 Drawing Sheets

(56) References Cited

U.S. PATENT DOCUMENTS

| | | | |
|---|---|---|---|
| 2006/0097410 A1* | 5/2006 | Shim | H01L 27/10817 |
| | | | 257/798 |
| 2009/0008743 A1 | 1/2009 | Lee et al. | |
| 2010/0188795 A1* | 7/2010 | Kim | H01L 27/10852 |
| | | | 361/272 |
| 2014/0246724 A1 | 9/2014 | Jang et al. | |
| 2016/0133512 A1* | 5/2016 | Lee | H01L 21/76807 |
| | | | 438/666 |
| 2016/0284993 A1 | 9/2016 | Tada et al. | |

* cited by examiner

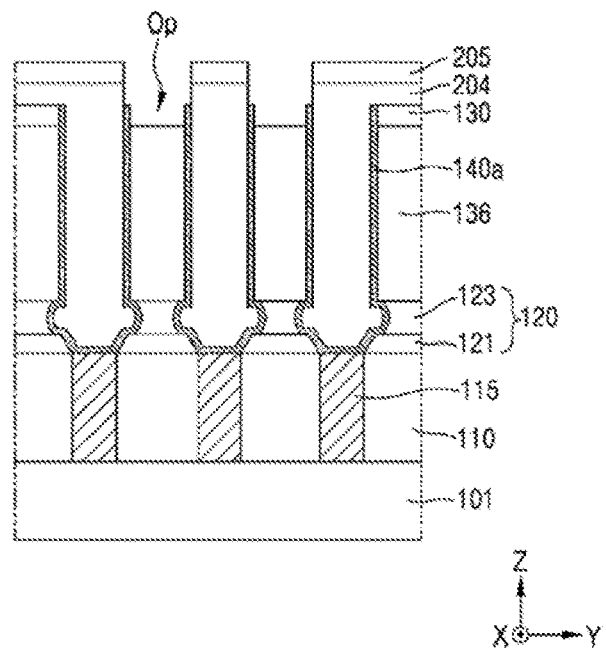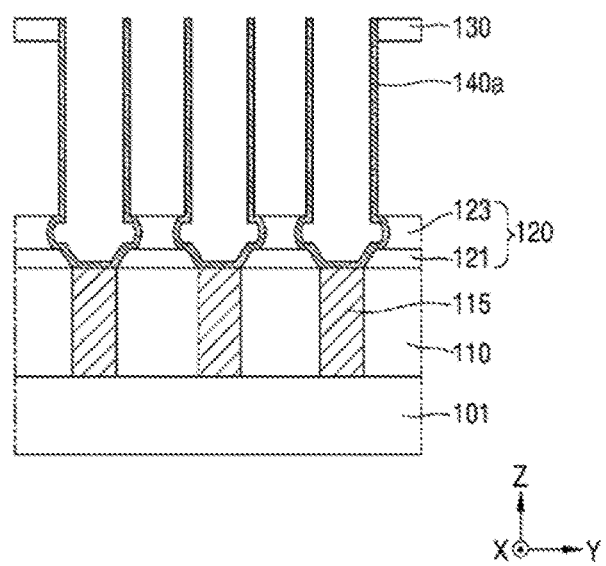

SEMICONDUCTOR MEMORY DEVICE

CROSS-REFERENCE TO RELATED APPLICATION

This application claims the benefit under 35 U.S.C. § 119 of Korean Patent Application No. 10-2017-0161000, filed on Nov. 28, 2017, in the Korean Intellectual Property Office, the disclosure of which is incorporated by reference herein in its entirety.

TECHNICAL FIELD

The present inventive concept relates to a semiconductor memory device, and more particularly, to a semiconductor memory device including a dual-etch stop pattern.

DISCUSSION OF RELATED ART

With the recent development of electronic technology, semiconductor devices have been rapidly downscaled. As the downscaling of the semiconductor devices advances, difficulties in forming a uniform material layer in a space with a narrow line width increase. As a result, there is a need to develop a structure for solving this problem and a technique for implementing the structure.

SUMMARY

The present inventive concept provides a semiconductor memory device with enhanced reliability.

According to an aspect of the present inventive concept, there is provided a semiconductor memory device including: a plurality of lower electrodes located on a substrate and spaced apart from one another; and an etch stop pattern located on the substrate and surrounding at least a part of each of the plurality of lower electrodes, in which the etch stop pattern includes: a first etch stop pattern including carbon; and a second etch stop pattern located on the first etch stop pattern and including a material different from a material of the first etch stop pattern.

According to another aspect of the present inventive concept, there is provided a semiconductor memory device including: a plurality of lower electrodes located on a substrate and spaced apart from one another; a first etch stop pattern located on the substrate and surrounding a lower portion of a sidewall of each of the plurality of lower electrodes; and a second etch stop pattern located on the first etch stop pattern, in which a horizontal cross-sectional area of the second etch stop pattern varies in a vertical direction.

According to another aspect of the present inventive concept, there is provided a semiconductor memory device including: a plurality of lower electrodes located on a substrate and spaced apart from one another; a first etch stop pattern located on the substrate and surrounding a lower portion of each of the plurality of lower electrodes; and a second etch stop pattern located on the first etch stop pattern, in which each of the plurality of lower electrodes includes: a first portion arranged at a first level; a second portion arranged at a second level higher than the first level; and a third portion arranged at a third level higher than the second level, in which a horizontal cross-sectional area of the second portion is greater than a horizontal cross-sectional area of the third portion.

BRIEF DESCRIPTION OF THE DRAWINGS

Example embodiments of the present inventive concept will be more clearly understood from the following detailed description taken in conjunction with the accompanying drawings in which:

FIGS. 3 to 9 are cross-sectional views for explaining a method of providing a semiconductor memory device according to an example embodiment of the present inventive concept;

Figure 1:
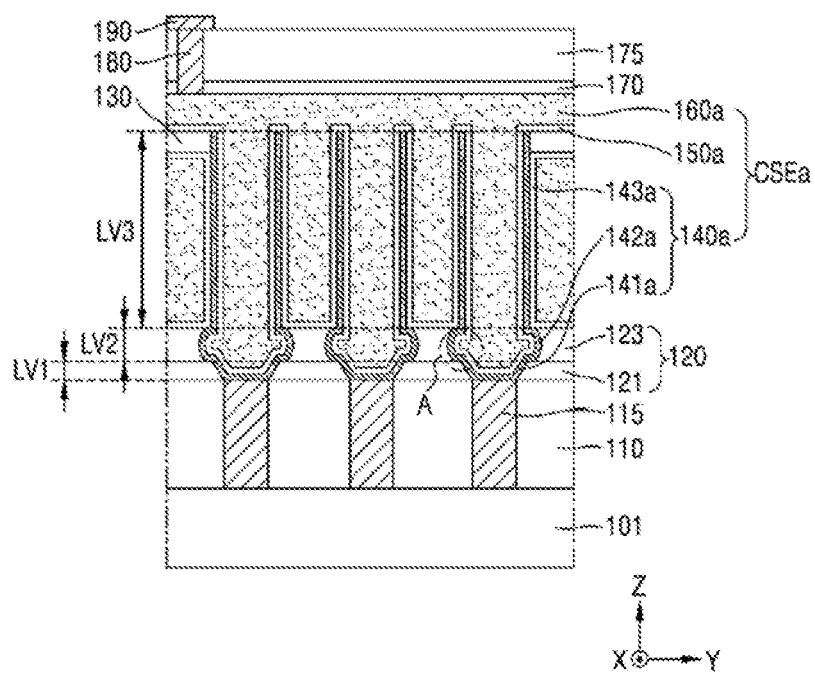
FIG. 1 is a cross-sectional view of a semiconductor memory device according to an example embodiment of the present inventive concept.

Since the drawings in FIGS. 1-22 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

Reference will now be made in detail to embodiments of the present inventive concept, examples of which are illustrated in the accompanying drawings. In the drawings, the same elements are denoted by the same reference numerals, and a repeated explanation thereof will not be given.

FIG. 1 is a cross-sectional view of a semiconductor memory device 100a according to an example embodiment of the present inventive concept.

Referring to FIG. 1, the semiconductor memory device 100a may include charge storage elements CSEa such as a capacitor, and an etch stop pattern 120, located on a substrate 101.

The substrate 101 may include a group IV semiconductor and/or a III-V compound semiconductor. In an example embodiment of the present inventive concept, the substrate 101 may include silicon (Si). In an example embodiment of the present inventive concept, the substrate 101 may include, for example, single-crystal silicon, polycrystalline silicon, or amorphous silicon. In an example embodiment of the present inventive concept, the substrate 101 may include at least one of, for example, germanium (Ge), silicon germanium (SiGe), silicon carbide (SiC), gallium arsenide (GaAs), indium arsenide (InAs), and indium phosphide (InP). In an example embodiment of the present inventive concept, the substrate 101 may be a silicon-on-insulator (SOI) substrate, or a germanium-on-insulator (GOI) substrate. In an example embodiment of the present inventive concept, the substrate 101 may include a conductive region, for example, a structure doped with an impurity or a well doped with an impurity. In addition, the substrate 101 may include one or more semiconductor layers or structures and may include active or operable portions of semiconductor devices.

In FIG. 1, two directions that are parallel to a top surface of the substrate 101 and intersect each other are referred to as a first direction (e.g., an X direction) and a second direction (e.g., a Y direction), and a direction substantially perpendicular to the top surface of the substrate 101 is referred to as a third direction (e.g., a Z direction). The first direction (e.g., the X direction) and the second direction (e.g., the Y direction) may be substantially perpendicular to each other. The third direction (e.g., the Z direction) is perpendicular to the first direction (e.g., the X direction) and the second direction (e.g., the Y direction). A direction marked by an arrow in FIG. 1 and a direction opposite thereto are described as the same direction. The definition of the above directions for FIG. 1 also applies to other drawings.

A lower insulating film 110 may be formed on the substrate 101. The lower insulating film 110 may include an insulating material. In an example embodiment of the present inventive concept, the lower insulating film 110 may include at least one of, for example, a silicon oxide ($SiO_2$) film, a silicon nitride ($Si_3N_4$) film, and a silicon oxynitride (SiON) film. In an example embodiment of the present inventive concept, the lower insulating film 110 may include a silicon oxide-based material such as, for example, plasma enhanced oxide (PEOX), tetraethyl orthosilicate (TEOS), or silicate glass.

A lower contact 115 may pass through at least a part of the lower insulating film 110 and may extend in the third direction (e.g., the Z direction). In an example embodiment of the present inventive concept, the lower contact 115 may include a conductive material. In an example embodiment of the present inventive concept, the lower contact 115 may include, for example, polysilicon or a metal material. The polysilicon may be doped with an impurity. The metal material may include but is not limited to, for example, at least one of tungsten (W), aluminum (Al), cobalt (Co), copper (Cu), ruthenium (Ru), iridium (Ir), nickel (Ni), platinum (Pt), and any combination thereof. Besides the doped polysilicon and the metal material, the lower contact 115 may include, for example, a metal nitride and/or a metal silicide. A barrier metal such as, for example, titanium (Ti) or a double layer structure including, for example, titanium/titanium nitride (Ti/TiN) may be further provided over the lower contact 115.

The substrate 101, the lower insulating film 110, and the lower contact 115 will be described below in more detail with reference to FIGS. 10 to 22.

In an example embodiment of the present inventive concept, each of the charge storage elements CSEa may include a lower electrode 140a, an upper electrode 160a, and a dielectric film 150a located between the lower electrode 140a and the upper electrode 160a.

In an example embodiment of the present inventive concept, a plurality of the lower electrodes 140a may be arranged in a plurality of rows and columns in the first direction (e.g., the X direction) and the second direction (e.g., the Y direction). In an example embodiment of the present inventive concept, the lower electrodes 140a may be located on the lower contacts 115. However, the present inventive concept is not limited thereto. For example, some of the lower electrodes 140a may be misaligned and may partially contact the lower insulating film 110. In an example embodiment of the present inventive concept, the lower electrodes 140a may contact the lower contacts 115. In an example embodiment of the present inventive concept, the lower electrodes 140a may each include a conductive material and may be electrically connected to the lower contacts 115. In an example embodiment of the present inventive concept, each of the lower electrodes 140a may include a doped semiconductor material such as polycrystalline silicon doped with an impurity. In an example embodiment of the present inventive concept, each of the lower electrodes 140a may include a nitride of a conductive metal such as, for example, titanium nitride (TiN), tantalum nitride (TaN), or tungsten nitride (WN). In an example embodiment of the present inventive concept, each of the lower electrodes 140a may include a metal material such as, for example, ruthenium (Ru), iridium (Ir), titanium (Ti), or tantalum (Ta). In an example embodiment of the present inventive concept, each of the lower electrodes 140a may include a conductive metal oxide such as, for example, iridium oxide ($IrO_2$).

In an example embodiment of the present inventive concept, the lower electrodes 140a may be located at vertices and centers of substantially regular hexagons in a honeycomb structure. An arrangement of the lower electrodes 140a in the honeycomb structure is well known to one of ordinary skill in the art, and thus a detailed explanation thereof will not be given. However, the present disclosure is not limited thereto, and the lower electrodes 140a may be arranged in various forms besides the hexagonal honeycomb. For example, the lower electrodes 140a may be arranged in a form of a tetragon. When the lower electrodes 140a are located in the honeycomb structure, the lower electrodes 140a constituting one row and the lower electrodes 140a constituting an adjacent column may be alternately arranged. For example, the lower electrodes 140a disposed at each of rows may be arranged linearly in the first direction (e.g., the X direction). The lower electrodes 140a disposed at even and odd rows may be arranged in a zig-zag fashion in the second direction (e.g., the Y direction). In an example embodiment of the present inventive concept, since the lower electrodes 140a are alternately arranged, a relatively wide space is secured between the lower electrodes 140a, thereby making it possible to conformally form the dielectric film 150a.

In an example embodiment of the present inventive concept, an aspect ratio of each of the lower electrodes 140a may be very high. For example, the aspect ratio of each of the lower electrodes 140a may range from about 10 to about 40. In an example embodiment of the present inventive concept, a width of each of the lower electrodes 140a may range from, but is not limited to, about 20 nm to about 100 nm, and a height of each of the lower electrodes 140a may range from, but is not limited to, about 500 nm to about 4000 nm.

In an example embodiment of the present inventive concept, each of the lower electrodes 140a may have a substantially cylindrical shape. However, the present inventive concept is not limited thereto. For example, in an example embodiment of the present inventive concept, the lower electrodes 140a may include electrodes having pillar shapes (that are filled) and/or electrodes having cylindrical shapes located on the electrodes having the pillar shapes. Although the following is described on the assumption that the lower electrodes 140a having substantially cylindrical shapes are provided, the description may also apply to a case where lower electrodes 140a having a combination of electrodes having pillar shapes and electrodes having cylindrical shapes are provided.

In an example embodiment of the present inventive concept, the etch stop pattern 120 may be located on an insulating film, for example, the lower insulating film 110. However, the present inventive concept is not limited thereto. For example, a part of the etch stop pattern 120 may be located on the lower contact 115. In an example embodiment of the present inventive concept, the etch stop pattern 120 may surround at least parts of the lower electrodes 140a. In an example embodiment of the present inventive concept, the etch stop pattern 120 may surround lower portions of the lower electrodes 140a. In an example embodiment of the present inventive concept, the etch stop pattern 120 may surround outer walls of the lower electrodes 140a. For example, the etch stop pattern 120 may surround outer walls of the lower portions of the lower electrodes 140a. In an example embodiment of the present inventive concept, the etch stop pattern 120 may contact the outer walls of the lower electrodes 140a. For example, the etch stop pattern 120 may contact the outer walls of the lower portion of the lower electrodes 140a.

In an example embodiment of the present inventive concept, the etch stop pattern 120 may include a first etch stop pattern 121 and a second etch stop pattern 123. In an example embodiment of the present inventive concept, the first and second etch stop patterns 121 and 123 may each be formed as one body. In an example embodiment of the present inventive concept, the second etch stop pattern 123 may be located on the first etch stop pattern 121.

In an example embodiment of the present inventive concept, the first etch stop pattern 121 and the second etch stop pattern 123 may include different materials. In an example embodiment of the present inventive concept, the first etch stop pattern 121 may include carbon (C). In an example embodiment of the present inventive concept, the first etch stop pattern 121 may include, for example, silicon carbonitride (SiCN). In an example embodiment of the present inventive concept, the second etch stop pattern 123 may include boron (B). In an example embodiment of the present inventive concept, the second etch stop pattern 123 may include, for example, silicon boron nitride (SiBN).

In an example embodiment of the present inventive concept, a vertical thickness of the first etch stop pattern 121 and a vertical thickness of the second etch stop pattern 123 may be different from each other. In an example embodiment of the present inventive concept, the vertical thickness of the first etch stop pattern 121 may be less than the vertical thickness of the second etch stop pattern 123. The term 'vertical thickness' refers to a length in the third direction (e.g., the Z direction), and the term 'vertical direction' may substantially the same as the third direction (e.g., the Z direction).

In an example embodiment of the present inventive concept, a horizontal cross-sectional area of the first etch stop pattern 121 may vary in the third direction (e.g., the Z direction). In an example embodiment of the present inventive concept, the horizontal cross-sectional area of the first etch stop pattern 121 may decrease as it goes away from the substrate 101 in the third direction (e.g., the Z direction). That is, for two horizontal cross-sectional areas of the first etch stop pattern 121 at two different heights from the substrate 101, the one near the substrate 101 is larger than the one away from the substrate 101. In an example embodiment of the present inventive concept, the horizontal cross-sectional area of the first etch stop pattern 121 may have a maximum value at a bottom surface and may have a minimum value at a top surface.

In an example embodiment of the present inventive concept, a horizontal cross-sectional area of the second etch stop pattern 123 may vary in the third direction (e.g., the Z direction). In an example embodiment of the present inventive concept, the horizontal cross-sectional area of the second etch stop pattern 123 may decrease when it goes away from the substrate 101 in the third direction (e.g., the Z direction) and then may increase again at a predetermined point. In an example embodiment of the present inventive concept, the horizontal cross-sectional area of the second etch stop pattern 123 may have a minimum value around or substantially at a middle portion in the third direction (e.g., the Z direction). In an example embodiment of the present inventive concept, the horizontal cross-sectional area may decrease from a bottom surface to the substantially middle portion of the second etch stop pattern 123, and may increase from the substantially middle portion to a top surface of the second etch stop pattern 123. In an example embodiment of the present inventive concept, the horizontal cross-sectional area of the second etch stop pattern 123 may have a maximum value at any or both of the bottom surface and the top surface, and may have a minimum value around or substantially at the middle portion.

In an example embodiment of the present inventive concept, the horizontal cross-sectional area of the first etch stop pattern 121 may be greater than the horizontal cross-sectional area of the second etch stop pattern 123. In an example embodiment of the present inventive concept, a minimum horizontal cross-sectional area of the first etch stop pattern 121 may be greater than a maximum horizontal cross-sectional area of the second etch stop pattern 123. In an example embodiment of the present inventive concept, a horizontal cross-sectional area of the top surface of the first etch stop pattern 121 may be greater than a horizontal cross-sectional area of the bottom surface of the second etch stop pattern 123. In an example embodiment of the present inventive concept, a part of the top surface of the first etch stop pattern 121 may contact each of the lower electrodes 140a. In other words, the top surface of the first etch stop pattern 121 may contact the second etch stop pattern 123 and each of the lower electrodes 140a.

Hereinafter, a vertical level that is substantially the same as that of the first etch stop pattern 121, that is, a level in the third direction (e.g., the Z direction), is referred to as a first level LV1, a vertical level that is substantially the same as that of the second etch stop pattern 123 is referred to as a second level LV2, and a level from the top surface of the second etch stop pattern 123 to an upper end of each of the lower electrodes 140a is referred to as a third level LV3. The second level LV2 may be higher than the first level LV1, and the third level LV3 may be higher than the second level LV2. Thus, the first, second and third levels LV1, LV2 and LV3 may be sequentially and vertically arranged upward from the top surface of the lower insulation film 110. Each of the first, second and third levels LV1, LV2 and LV3 may represent a range of height in the third direction (e.g., the Z direction).

In an example embodiment of the present inventive concept, the lower electrodes 140a may be divided into different portions according to the first through third levels LV1, LV2, and LV3. The division of the lower electrodes 140a is just for convenience of explanation, and the lower electrodes 140a may be actually integrally provided. For example, the divided different portions of the lower electrodes 140a may be formed of the same material and may also be formed at the same time.

A portion formed to have a level that is substantially the same as the first level LV1 of each of the lower electrodes 140a may be defined as a first portion 141a, a portion formed to have a level that is substantially the same as the second level LV2 of each of the lower electrodes 140a may be defined as a second portion 142a, and a portion formed to have a level that is substantially the same as the third level LV3 of each of the lower electrodes 140a may be defined as a third portion 143a.

Each of the lower electrodes 140a according to an example embodiment of the present inventive concept may have a substantially cylindrical shape and may have an annular horizontal cross-sectional shape. A horizontal cross-sectional area of the lower electrode 140a refers to an area including an inner space surrounded by the lower electrode 140a, on a cross-section that is perpendicular to the third direction (e.g., the Z direction) and passes through the lower electrode 140a. The definition of the horizontal cross-sectional area for the lower electrode 140a applies to any element having a structure (i.e., a hollow structure) similar to that of the lower electrode 140a, for example, the dielectric film 150a, unless specially described. For example, a horizontal cross-sectional area of the dielectric film 150a may refer to an area including an inner space surrounded by the dielectric film 150a, on a cross-section that is perpendicular to the third direction (e.g., the Z direction) and passes through the dielectric film 150a.

In an example embodiment of the present inventive concept, the first portion 141a of the lower electrode 140a may have a hollow truncated cone shape. In an example embodiment of the present inventive concept, a horizontal cross-sectional area of the first portion 141a of the lower electrode 140a may vary in the third direction (e.g., the Z direction). In an example embodiment of the present inventive concept, the horizontal cross-sectional area of the first portion 141a of the lower electrode 140a may decrease as it goes toward the substrate 101. That is, for two horizontal cross-sectional areas of the first portion 141a of the lower electrode 140a at two different heights from the substrate 101, the one near the substrate 101 is smaller than the one away from the substrate 101. For example, the horizontal cross-sectional area of the first portion 141a of the lower electrode 140a may have a minimum value at a bottom surface. In an example embodiment of the present inventive concept, a width of the bottom surface of the first portion 141a of the lower electrode 140a in the second direction (e.g., the Y direction) may be substantially the same as a width of a top surface of the lower contact 115 in the second direction (e.g., the Y direction).

In an example embodiment of the present inventive concept, the lower electrode 140a may protrude outward at the second level LV2. In an example embodiment of the present inventive concept, a horizontal cross-sectional area of the second portion 142a of the lower electrode 140a may increase as it goes away from the substrate 101, and then may decrease again. In an example embodiment of the present inventive concept, the horizontal cross-sectional area of the second portion 142a of the lower electrode 140a may have a maximum value at a central portion in the third direction (e.g., the Z direction). Accordingly, a sufficient space for forming the dielectric film 150a in the second portion 142a of the lower electrode 140a may be secured. An inner space of the second portion 142a refers to a space surrounded by the lower electrode 140a, from among spaces at the second level LV2. Accordingly, the dielectric film 150a may be reliably provided, and the reliability of the semiconductor memory device 100a may be enhanced. In an example embodiment of the present inventive concept, the horizontal cross-sectional area of the second portion 142a of the lower electrode 140a may have a minimum value at any of both ends in the third direction (e.g., the Z direction). For example, the horizontal cross-sectional area of the second portion 142a of the lower electrode 140a may increase from a lower end to the central portion, and then may decrease from the central portion to a higher end of the second portion 142a of the lower electrode 140a.

In an example embodiment of the present inventive concept, a third portion 143a of the lower electrode 140a may have a circular tube shape. In an example embodiment of the present inventive concept, the third portion 143a of the lower electrode 140a may become narrower as it goes toward the substrate 101. In an example embodiment of the present inventive concept, a cross-sectional profile of the third portion 143a of the lower electrode 140a in the third direction (e.g., the Z direction) may have a gradient with an angle ranging from about 89° to about 89.9°. In an example embodiment of the present inventive concept, an angle between the top surface of the substrate 101 and the third portion 143a of the lower electrode 140a may be greater than an angle between the top surface of the substrate 101 and the first portion 141a of the lower electrode 140a. In other words, the gradient of the cross-sectional profile of the third portion 143a of the lower electrode 140a in the vertical direction is greater than a gradient of a cross-sectional profile of the first portion 141a of the lower electrode 140a in the vertical direction.

In an example embodiment of the present inventive concept, the horizontal cross-sectional area of the second portion 142a of the lower electrode 140a may be greater than the horizontal cross-sectional area of the first portion 141a of the lower electrode 140a. In an example embodiment of the present inventive concept, a minimum horizontal cross-sectional area of the second portion 142a of the lower electrode 140a may be greater than a maximum horizontal cross-sectional area of the first portion 141a of the lower electrode 140a. In an example embodiment of the present inventive concept, the horizontal cross-sectional area of the second portion 142a of the lower electrode 140a may be greater than the horizontal cross-sectional area of the third portion 143a of the lower electrode 140a. In an example embodiment of the present inventive concept, the minimum horizontal cross-sectional area of the second portion 142a of the lower electrode 140a may be greater than a maximum horizontal cross-sectional area of the third portion 143a of the lower electrodes 140a. In an example embodiment of the present inventive concept, the horizontal cross-sectional area of the third portion 143a of the lower electrode 140a may be equal to or greater than the horizontal cross-sectional area of the first portion 141a of the lower electrode 140a. In an example embodiment of the present inventive concept, a cross-sectional profile of the lower electrode 140a in the vertical direction (e.g., the Z direction) may have inflection points at a boundary between the first and second portions 141a and 142a and a boundary between the second and third portions 142a and 143a.

In an example embodiment of the present inventive concept, the semiconductor memory device 100a may further include a support pattern 130 to prevent collapse of the lower electrodes 140a each having a high aspect ratio. The support pattern 130 may be formed as one body including a plurality of open portions Op (see FIG. 7). In an example embodiment of the present inventive concept, the open portions Op may be formed according to a predetermined rule, and may open one or more lower electrodes 140a. When the open portions Op of the support pattern 130 open the lower electrodes 140a, it indicates a structure of the support pattern 130 before the dielectric film 150a and the upper electrode 160a are deposited (see FIGS. 7-9). After the dielectric film 150a and the upper electrode 160a are formed, the lower electrodes 140a are covered by the dielectric film 150a and the upper electrode 160a, and thus the lower electrodes 140a may not be opened through the open portions Op (see FIGS. 8 and 9). The support pattern 130 may include, for example, a silicon nitride ($Si_3N_4$) film or an undoped polysilicon film.

Referring back to FIG. 1, although the support pattern 130 is provided as a single layer, the present inventive concept is not limited thereto. For example, two or more layers may be provided according to factors such as an aspect ratio and a height of each of the lower electrodes 140a. For example, in an example embodiment of the present inventive concept, the semiconductor memory device 100a may further include an additional support pattern formed at a substantially intermediate level in the third direction (e.g., the Z direction).

The dielectric film 150a may be conformably formed on surfaces of the lower electrodes 140a, a surface of the support pattern 130, and a top surface of the etch stop pattern 120. In an example embodiment of the present inventive concept, the dielectric film 150a may include a metal oxide such as, for example, hafnium oxide ($HfO_2$), zirconium oxide ($ZrO_2$), aluminum oxide ($Al_2O_3$), lanthanum oxide ($La_2O_3$), tantalum oxide ($Ta_2O_3$), or titanium oxide ($TiO_2$). In an example embodiment of the present inventive concept, the dielectric film 150a may include a dielectric material having a perovskite structure such as, for example, strontium titanate ($SrTiO_3$, STO), barium strontium titanate (($Ba,Sr$)$TiO_3$, BST), barium titanate ($BaTiO_3$), lead zirconium titanate ($Pb(Zr,Ti)O_3$, PZT), or lead lanthanum zirconium titanate (($Pb,La$)($Zr,Ti$)$O_3$, PLZT). In an example embodiment of the present inventive concept, the dielectric film 150a may be formed as a single film or a combination of a plurality of films. In an example embodiment of the present inventive concept, as shown in a portion A of FIG. 1, at least a part of the second portion 142a of each of the lower electrodes 140a may be located between the dielectric film 150a and the first etch stop pattern 121.

The upper electrode 160a may be formed on the dielectric film 150a and may cover the lower electrodes 140a. Referring to FIG. 1, when the dielectric film 150a has a substantially cylindrical shape, the upper electrode 160a may fill the inside of the cylindrical shape. In an example embodiment of the present inventive concept, the upper electrode 160a may include a conductive material. In an example embodiment of the present inventive concept, the upper electrode 160a may include a doped semiconductor material such as polycrystalline silicon doped with an impurity. In an example embodiment of the present inventive concept, the upper electrode 160a may include a metal material such as, for example, ruthenium (Ru), iridium (Ir), titanium (Ti), or tantalum (Ta). In an example embodiment of the present inventive concept, the upper electrode 160a may include a nitride of a conductive metal such as, for example, titanium nitride (TiN), tantalum nitride (TaN), or tungsten nitride (WN). In an example embodiment of the present inventive concept, the upper electrode 160a may include a conductive metal oxide such as, for example, iridium oxide ($IrO_2$).

A passivation film 170 may be located on the upper electrode 160a, and may cover the upper electrode 160a. In an example embodiment of the present inventive concept, the passivation film 170 may include, for example, silicon nitride ($Si_3N_4$). In an example embodiment of the present inventive concept, the passivation film 170 may prevent charges stored in the charge storage element CSEa from leaking.

An upper insulating film 175 may be located on the passivation film 170, and may include a material that is substantially the same as or similar to that of the lower insulating film 110.

An upper contact 180 may extend in the upper insulating film 175 and the passivation film 170 in the third direction (e.g., the Z direction), and may be configured to be electrically connected to the upper electrode 160a. In an example embodiment of the present inventive concept, the upper contact 180 may include a conductive material such as, for example, a metal, doped polysilicon, a metal nitride, and/or a metal silicide. In an example embodiment of the present inventive concept, the lower contact 115 may be separately provided for each of the charge storage elements CSEa, or may be commonly provided for a predetermined number of charge storage elements CSEa connected to the upper contact 180.

An upper wiring 190 that is conductive and is electrically connected to the upper contact 180 may be further located on the upper insulating film 175. The upper wiring 190 may extend in a direction parallel to the top surface of the substrate 101.

In an example embodiment of the present inventive concept, each of the dielectric film 150a and the upper electrode 160a may have a structure protruding outward from a portion surrounded by the second portion 142a of each of the lower electrodes 140a.

As described above, the aspect ratio of the lower electrodes 140a may be very high and may range from about 10 to about 40. However, the horizontal cross-sectional area of the second portion 142a of the lower electrode 140a may be greater than the horizontal cross-sectional area of the third portion 143a of the lower electrode 140a, thus, the inner space of the second portion 142a of the lower electrode 140a may be larger. Accordingly, despite high aspect ratio of the lower electrodes 140a, the dielectric film 150a may be reliably provided on the lower electrodes 140a to have a uniform thickness due to the larger inner space of the second portion 142a of each of the lower electrodes 140a. As a result, the reliability of the semiconductor memory device 100a may be enhanced.

Figure 2:
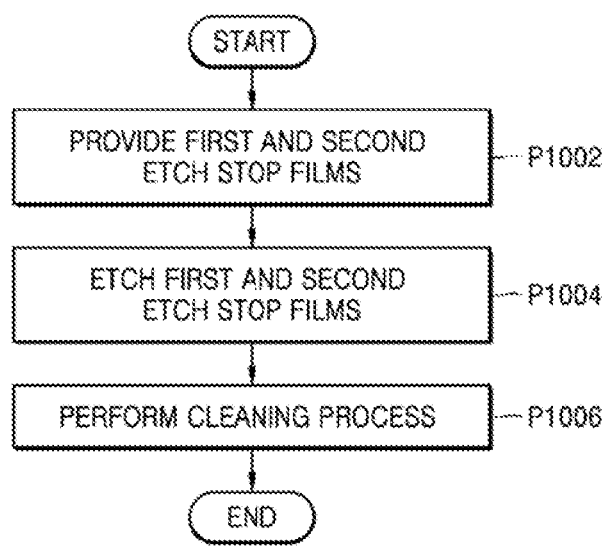
FIG. 2 is a flowchart of a method of providing a semiconductor memory device according to an example embodiment of the present inventive concept.

FIG. 2 is a flowchart for explaining a method of providing a semiconductor memory device according to an example embodiment of the present inventive concept.

FIGS. 3 to 9 are cross-sectional views for explaining a method of providing a semiconductor memory device according to an example embodiment of the present inventive concept.

Figure 3:
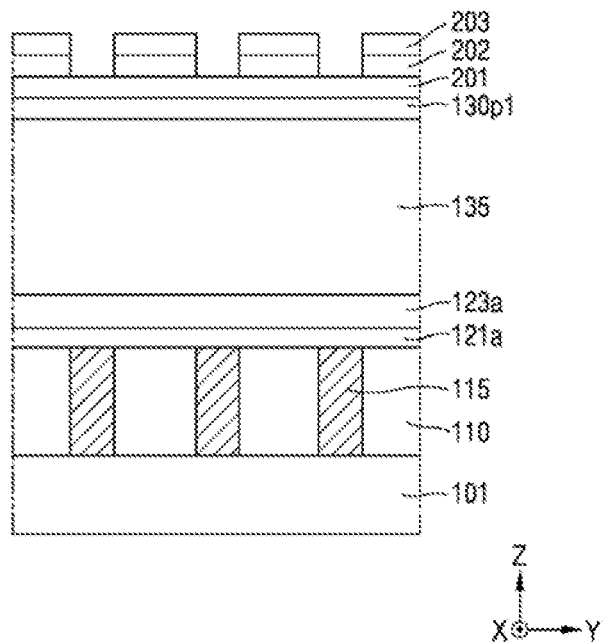

Referring to FIGS. 2 and 3, in operation P1002, first and second etch stop films 121a and 123a may be provided.

In an example embodiment of the present inventive concept, the lower insulating film 110, the lower contacts 115, the first and second etch stop films 121a and 123a, and a mold layer 135 may be provided on the substrate 101.

In an example embodiment of the present inventive concept, the substrate 101 may include a material that is substantially the same as that described with reference to FIG. 1. In an example embodiment of the present inventive concept, the lower insulating film 110 may include a material that is substantially the same as that described with reference to FIG. 1. In addition, the substrate 101 may include one or more semiconductor layers or structures and may include active or operable portions of semiconductor devices. For example, the substrate 101 may include the active or operable portions of the semiconductor devices having a buried cell array transistor (BCAT) structure. In an example embodiment of the present inventive concept, the lower insulating film 110 may be provided by a chemical vapor deposition (CVD) process. In an example embodiment of the present inventive concept, the lower insulating film 110 may be formed on the substrate 101 and may cover the circuit device.

In an example embodiment of the present inventive concept, a plurality of contact holes may be formed by partially etching the lower insulating film 110, and a conductive material layer may be provided to fill the contact holes. In an example embodiment of the present inventive concept, the conductive material may be formed by, for example, a CVD process, a physical vapor deposition (PVD), or an atomic layer deposition (ALD) process. In an example embodiment of the present inventive concept, the conductive material layer may include a material that is substantially the same as that of the lower contacts 115 described with reference to FIG. 1. Next, the lower contacts 115 may be formed by planarizing a top surface of the conductive material layer using a chemical mechanical polishing (CMP) process and/or an etch-back process. In an example embodiment of the present inventive concept, the lower contacts 115 may be configured to be electrically connected to the charge storage elements CSEa (see FIG. 1) formed on the substrate 101 in a subsequent process.

In an example embodiment of the present inventive concept, the first and second etch stop films 121a and 123a may be provided on the lower insulating film 110 and the lower contacts 115. In an example embodiment of the present inventive concept, the first etch stop film 121a may include a material that is substantially the same as that of the first etch stop pattern 121 described with reference to FIG. 1. In an example embodiment of the present inventive concept, the second etch stop film 123a may include a material that is substantially the same as that of the second etch stop pattern 123 described with reference to FIG. 1.

In an example embodiment of the present inventive concept, the first etch stop film 121a may be formed by, for example, a CVD process, a low-pressure CVD (LPCVD) process, a plasma-enhanced CVD (PECVD) process, a PVD process, or an ALD process. In an example embodiment of the present inventive concept, in order to form the first etch stop film 121a, any one from among, for example, monosilane (MS) with formula $SiH_4$, dichlorosilane (DCS) with formula $SiH_2Cl_2$, trichlorosilane (TCS) with formula $SiHCl_3$, hexachlorosilane (HCD) with formula $Si_2Cl_6$, and disilane with formula $Si_2H_6$ may be used as a silicon source. However, the above materials are exemplary, the present inventive concept is not limited thereto, and any of well-known silicon sources for forming the first etch stop film 121a may be used. In an example embodiment of the present inventive concept, in order to form the first etch stop film 121a, for example, timethylsilane (TMS) with formula $(CH_3)_3SiH$ may be used as a carbon source and ammonia with formula $NH_3$ may be used as a nitrogen source. However, the above materials are exemplary, the present inventive concept is not limited thereto, and any of well-known carbon and nitrogen sources for forming the first etch stop film 121a may be used.

In an example embodiment of the present inventive concept, the second etch stop film 123a may be formed by, for example a CVD process, an LPCVD process, a PECVD process, an ALD process, or a PVD process. In an example embodiment of the present inventive concept, in order to form the second etch stop film 123a, any one from among, for example, MS, DCS, TCS, HCD, and disilane may be used as a silicon source. However, the above materials are exemplary, the present inventive concept is not limited thereto, and any of well-known silicon sources for forming the second etch stop film 123a may be used. In an example embodiment of the present inventive concept, in order to form the second etch stop film 123a, boron trichloride ($BCl_3$) or diborane ($B_2H_6$) may be used as a boron source, and ammonia ($NH_3$) may be used as a nitrogen source. However, the above materials are exemplary, the present inventive concept is not limited thereto, and any of well-known boron and nitrogen sources for forming the second etch stop film 123a may be used.

The mold layer 135 may be formed on the second etch stop film 123a. In an example embodiment of the present inventive concept, the mold layer 135 may include an oxide film, and the oxide film may include an oxide material such as, for example, borophosphosilicate glass (BPSG), spin-on dielectric (SOD), phosphosilicate glass (PSG), low-pressure tetraethyl orthosilicate (LPTEOS), or plasma-enhanced tetraethyl orthosilicate (PETEOS). In an example embodiment of the present inventive concept, a thickness of the mold layer 135 may range from, but is not limited to, about 500 nm to about 4000 nm. In an example embodiment of the present inventive concept, the mold layer 135 may be formed by, for example, a CVD process or a spin coating process.

After the mold layer 135 is formed, a first support layer 130p1 may be formed on the mold layer 135. The first support layer 130p1 may prevent collapse of the lower electrodes 140a (see FIG. 1) after the mold layer 135 is removed in a subsequent wet etching process. In an example embodiment of the present inventive concept, the first support layer 130p1 may include, for example, a silicon nitride ($Si_3N_4$) film or an undoped polysilicon film. In an example embodiment of the present inventive concept, the first support layer 130p1 may have a thickness ranging from about 20 nm to about 150 nm, and may be formed as a single layer or a plurality of layers.

After the first support layer 130p1 is formed, a first sacrificial film 201 may be formed on the first support layer 130p1. The first sacrificial film 201 may include an oxide film such as, for example, a TEOS film, a BPSG film, a PSG film, an undoped silicate glass (USG) film, an SOD film, or a high-density plasma (HDP) oxide film, and may have a thickness ranging from about 50 nm to about 200 nm.

After the first sacrificial film 201 is formed, a hard mask film including, for example, an amorphous carbon or polysilicon film may be provided on the first sacrificial film 201, and then a photoresist may be applied and patterned through exposure and development to form a photoresist pattern 203. Regions where lower electrodes 140a are to be formed may be defined by the photoresist pattern 203. In an example embodiment of the present inventive concept, before the photoresist pattern 203 is formed, an anti-reflective coating may be further formed on the hard mask film. Next, a hard mask pattern 202 may be formed by etching the hard mask film using the photoresist pattern 203 as an etch mask.

Figure 4:
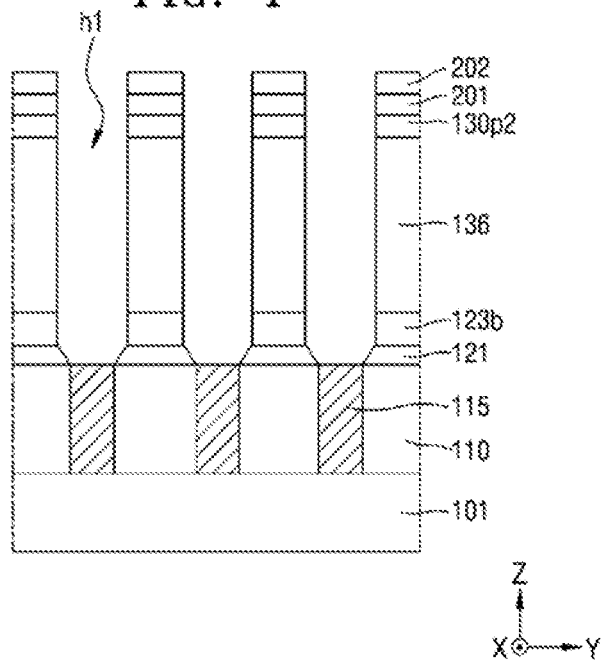

Referring to FIGS. 2 to 4, in operation P1004, the first and second etch stop films 121a and 123a may be etched. In an example embodiment of the present inventive concept, after the photoresist pattern 203 is removed, the first sacrificial film 201, the first support layer 130p1, the mold layer 135, and the first and second etch stop films 121a and 123a may be etched using the hard mask pattern 202 as an etch mask. Accordingly, a plurality of first holes h1 may be formed, and top surfaces of the lower contacts 115 may be exposed through the plurality of first holes h1.

Through the etching process, the first support layer 130p1 may become a second support layer 130p2, the mold layer 135 may become a mold pattern 136, the first etch stop film 121a may become the first etch stop pattern 121, and the second etch stop film 123a may become a third etch stop film 123b.

In an example embodiment of the present inventive concept, the etching process of operation P1004 may include a first etching process and a second etching process. In an example embodiment of the present inventive concept, the first etching process and the second etching process may be performed in situ.

In an example embodiment of the present inventive concept, the first etching process may be a dry or wet etching process. In an example embodiment of the present inventive concept, in the first etching process, the mold layer 135 exposed through the first holes h1 may be partially removed. In an example embodiment of the present inventive concept, the first etching process may be an etching process using the second etch stop film 123a as an etching end point and the hard mask pattern 202 as an etch mask.

When the mold layer 135 is dry-etched, sidewalls of portions of the first holes h1 formed at a level that is substantially the same as that of the mold layer 135 may each have a gradient with an angle ranging from about 89° to about 89.9°. Accordingly, although cross-sectional profiles of the first holes h1 formed over the first etch stop pattern 121 are substantially vertical in FIG. 4, lower line widths may be actually less than upper line widths of the first holes h1 above the first etch stop pattern 121 or above the third etch stop film 123b.

In an example embodiment of the present inventive concept, the second etching process may be a dry or wet etching process. In an example embodiment of the present inventive concept, the second etching process may be an etching process using the top surfaces of the lower contacts 115 as an etching end point. The first and second etch stop films 121a and 123a may be etched using the second etching process. An outer profile of the first etch stop pattern 121 formed through the second etching process may have a gradient smaller than that of a profile of the mold pattern 136. For example, the cross-sectional profile in the third direction (e.g., the Z direction) for the first etch stop pattern 121 is more tilted, and the cross-sectional profile in the third direction (e.g., the Z direction) for the mold pattern 136 is straighter. In an example embodiment of the present inventive concept, when the first and second etch stop films 121a and 123a are etched, upper portions of the lower contacts 115 may be partially etched and grooves having a predetermined size may be formed.

Figure 5:
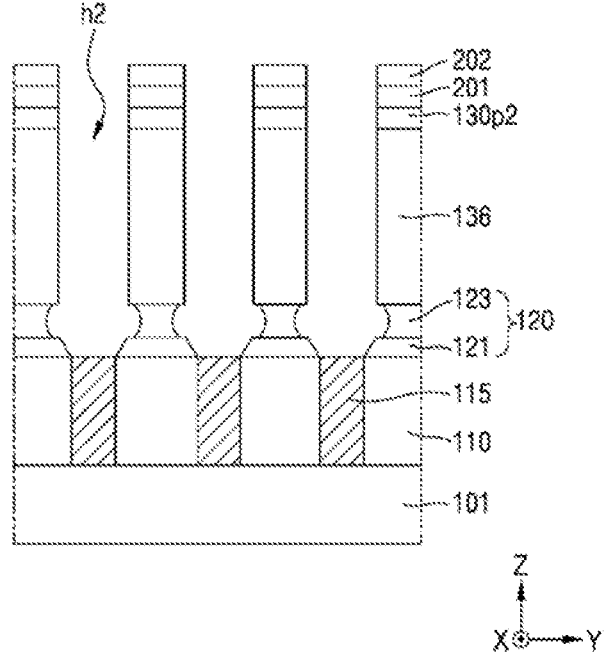

Referring to FIGS. 2, 4, and 5, in operation P1006, a cleaning process may be performed. In an example embodiment of the present inventive concept, a side surface portion of the third etch stop film 123b may be partially removed by the cleaning process, to form the second etch stop pattern 123. In an example embodiment of the present inventive concept, a cleaning solution including sulfur may be used as a cleaning solution in the cleaning process of operation P1006. In an example embodiment of the present inventive concept, in operation P1006, dilute sulfuric-peroxide (DSP) may be used as a cleaning solution in the cleaning process of operation P1006. DSP may remove post etch residues, and here may also etch the third etch stop film 123b.

However, the above cleaning solutions are exemplary, and any of cleaning solutions generally used in a cleaning process may be used. Accordingly, the second etch stop pattern 123 formed adjacent to each of the first holes h1 may have a recessed structure. The recessed structure may have a shape convex toward a central portion of the second etch stop pattern 123 in the cross-sectional profile taken along the third direction (e.g., the Z direction). Since the third etch stop film 123b includes SiBN, the third etch stop film 123b may be partially removed by the cleaning process. Accordingly, profiles of the first holes h1 may be changed, to form second holes h2. Also, the first etch stop pattern 121 and the second etch stop pattern 123 may constitute the etch stop pattern 120. In an example embodiment of the present inventive concept, each of the second holes h2 may be formed so that a horizontal cross-sectional area increases at a level that is substantially the same as that of the second etch stop pattern 123. In an example embodiment of the present inventive concept, as a boron concentration increases, the second etch stop pattern 123 may be further recessed by the same cleaning process under the same cleaning condition. Accordingly, a space occupied by each of the second holes h2 at a level that is substantially the same as that of the second etch stop pattern 123 may increase.

In an example embodiment of the present inventive concept, since a composition of the first etch stop pattern 121 is different from a composition of the third etch stop film 123b, the first etch stop pattern 121 may not be removed by the cleaning process. Since the first etch stop pattern 121 includes SiCN, the first etch stop pattern 121 may not be removed by the cleaning process. Accordingly, a margin between the lower electrodes 140a and the lower contacts 115 that do not contact the lower electrodes 140a (see FIG. 1) formed in a subsequent process but are adjacent to the lower electrodes 140a may be secured, thereby preventing unexpected a short-circuit or bridge between the lower electrodes 140a and the non-contact adjacent lower contacts 115.

The first etch stop pattern 121 and the second etch stop pattern 123 may include different materials with different etch characteristics as described above to enable the method of providing a semiconductor memory device according to an example embodiment of the present inventive concept. This dual-etch stop pattern approach may allow the second etch stop pattern 123 formed to have a recess structure, so that the inner space of the second portion 142a of the lower electrode 140a subsequently formed may be larger, and thus the dielectric film 150a may be reliably formed thereafter. In addition, this dual-etch stop pattern approach may also allow the first etch stop pattern 121 to be formed with smaller gradient (more tilted) in outer profile through the second etching process and not etched during the cleaning process, so that the margin between the lower electrodes 140a subsequently formed and the non-contact adjacent lower contacts 115 may be secured, and thus a short-circuit or bridge between the lower electrodes 140a and the non-contact adjacent lower contacts 115 subsequently formed may be prevented.

Figure 6:
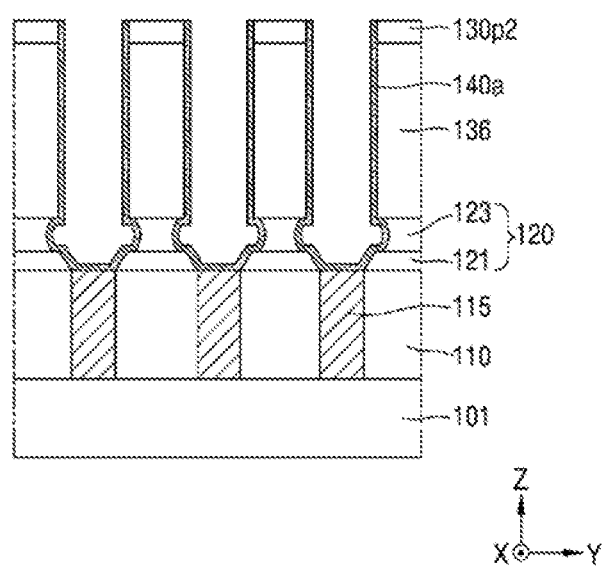

Referring to FIGS. 5 and 6, the hard mask film 202 may be removed, and then at least parts of the second holes h2 may be covered by depositing a conductive film on a resultant structure. After the conducting film is deposited on the resultant structure, it must be separated to form each of the lower electrodes 140a. Thus, the lower electrodes 140a that conformably fill parts of the second holes h2 may be formed by performing node separation. In an example embodiment of the present inventive concept, the node separation may be performed using a dry etch-back process or a CMP process. In an example embodiment of the present inventive concept, the first sacrificial film 201 may also be removed during the node separation. In an example embodiment of the present inventive concept, the first sacrificial film 201 may protect the second support layer 130p2 during the node separation.

In an example embodiment of the present inventive concept, the lower electrodes 140a may include any one from among, for example, a metal nitride film, a metal film, and a material film formed by combining a metal nitride and a metal. In an example embodiment of the present inventive concept, the lower electrodes 140a may include at least one of, for example, TiN, Ru, TaN, WN, platinum (Pt), and Ir. The lower electrodes 140a may be formed to a thickness ranging from about 20 nm to about 100 nm by, for example, a CVD process or an ALD process.

In an example embodiment of the present inventive concept, since the lower electrodes 140a are conformably formed, structures of the second holes h2 may be substantially transferred to the lower electrodes 140a. When grooves are formed in upper portions of the lower contacts 115 as described above, the lower electrodes 140a may be mounted in the grooves and may be firmly supported. In an example embodiment of the present inventive concept, upper portions of the lower electrodes 140a may be fixed and supported by the second support layer 130p2. In an example embodiment of the present inventive concept, lower portions of the lower electrodes 140a may be fixed and supported by the etch stop pattern 120 and may also be supported by the grooves in upper portions of the lower contacts 115.

Referring to FIG. 7, a second sacrificial film 204 may be formed to sufficiently fill the insides of the lower electrodes 140a, and then a photoresist pattern 205 may be formed on the second sacrificial film 204. In an example embodiment of the present inventive concept, the second sacrificial film 204 may include an oxide film which may include an oxide material such as, for example, TEOS, BPSG, PSG, USG, SOD, or HDP. Parts of the second sacrificial film 204 and the second support layer 130p2 may be etched using the photoresist pattern 205 as an etch mask. Accordingly, the support pattern 130 including the plurality of open portions Op may be provided.

In an example embodiment of the present inventive concept, surfaces of some of the lower electrodes 140a may be exposed through the open portions Op. In an example embodiment of the present inventive concept, the lower electrodes 140a may be respectively opened through the open portions Op. Accordingly, a wet etching solution may be injected through the open portions Op.

Referring to FIGS. 7 and 8, the photoresist pattern 205, the second sacrificial film 204, and the mold pattern 136 may be removed. In an example embodiment of the present inventive concept, the mold pattern 136 may be removed by a wet etching process. In an example embodiment of the present inventive concept, the wet etching process may be performed using a wet chemical such as hydrofluoric acid (HF) or a buffered oxide etchant (BOE). HF or BOE may provide very selective etching of the mold pattern 136 (e.g., a silicon oxide (SiO2) film) with respect to the support pattern 130 (e.g., a silicon nitride ($Si_3N_4$) film or an undoped polysilicon film). The wet chemical may be injected through the open portions Op formed in the support pattern 130 to etch the mold pattern 136. When the mold pattern 136 is etched, the second sacrificial film 204 that is an oxide film may also be removed.

In the wet etching process, the support pattern 130 may not be etched and may prevent collapse of the lower electrodes 140a. Also, the etch stop pattern 120 may support the lower electrodes 140a, may not be etched, and may prevent a wet etching solution from penetrating into a structure under the lower electrodes 140a and etching the lower insulating film 110.

Figure 9:
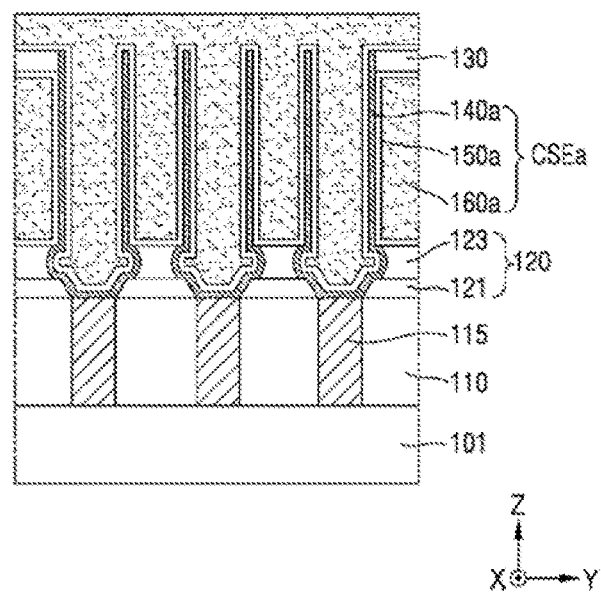

Referring to FIG. 9, the dielectric film 150a and the upper electrode 160a may be provided.

The dielectric film 150a may be conformably formed on a top surface of the etch stop pattern 120, an exposed surface of the support pattern 130, and exposed surfaces of the lower electrodes 140a. In an example embodiment of the present inventive concept, as spaces of portions in the lower electrodes 140a arranged at a level that is substantially the same as that of the second etch stop pattern 123 increase, despite high aspect ratios of the lower electrodes 140a, the dielectric film 150a may be reliably provided to have a uniform thickness. Accordingly, the reliability of the semiconductor memory device 100a may be enhanced.

The upper electrode 160a may be formed on the dielectric film 150a. In an example embodiment of the present inventive concept, the upper electrode 160a may be sufficiently provided to fill spaces surrounded by the dielectric film 150a. In an example embodiment of the present inventive concept, the upper electrode 160a may have a cap shape that covers the plurality of lower electrodes 140a.

The lower electrodes 140a, the dielectric film 150a, and the upper electrode 160a may constitute the charge storage elements CSEa. In an example embodiment of the present inventive concept, the upper electrode 160a may be provided as a common plate electrode of the charge storage elements CSEa.

Referring back to FIG. 1, the passivation film 170, the upper insulating film 175, the upper contact 180, and the upper wiring 190 may be provided over the upper electrodes 160a.

The passivation film 170 may be provided to cover the upper electrode 160a. In an example embodiment of the present inventive concept, the passivation film 170 may include silicon nitride ($Si_3N_4$), and may be formed by, for example, a PECVD process. The upper insulating film 175 may be formed on the passivation film 170. In an example embodiment of the present inventive concept, the upper insulating film 175 may include, but is not limited to, a material that is substantially the same as or similar to that of the lower insulating film 110.

The upper contact 180 may pass through the upper insulating film 175 and the passivation film 170 and may contact the upper electrode 160a. In an example embodiment of the present inventive concept, a contact hole through which the upper electrode 160a is exposed may be formed by sequentially etching the upper insulating film 175 and the passivation film 170. Next, the upper contact 180 may be formed by filling a conductive material such as, for example, a metal, doped polysilicon, a metal nitride, and/or a metal silicide in the contact hole. The upper wiring 190 configured to be electrically connected to the upper contact 180 may be further formed on the upper insulating film 175.

FIGS. 10 to 22 are cross-sectional views for explaining a semiconductor apparatus 1000 and a method of manufacturing the semiconductor apparatus 1000 according to an example embodiment of the present inventive concept.

Figure 10:
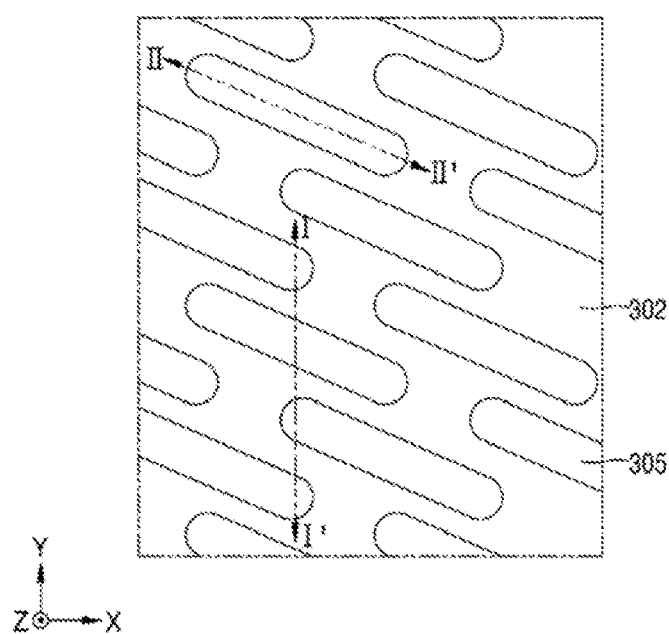
FIG. 10 is a plan view for explaining a method of providing a semiconductor memory device according to an example embodiment of the present inventive concept.
Figure 12:
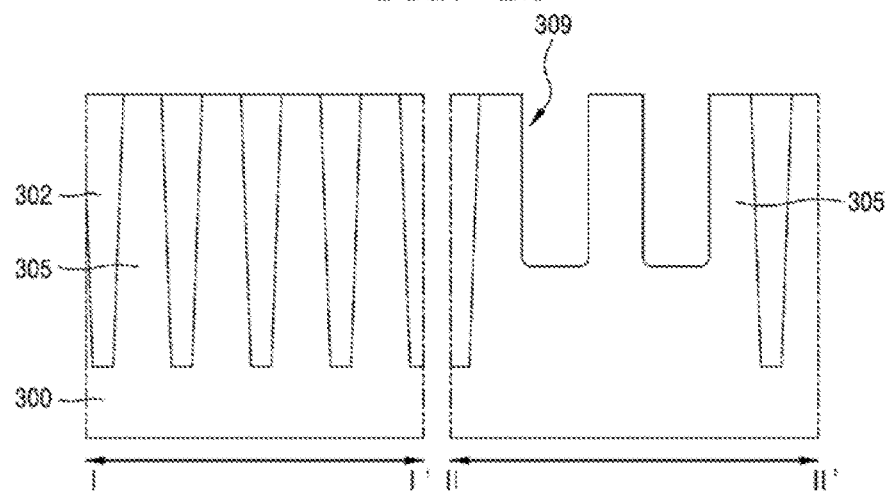
Figure 13:
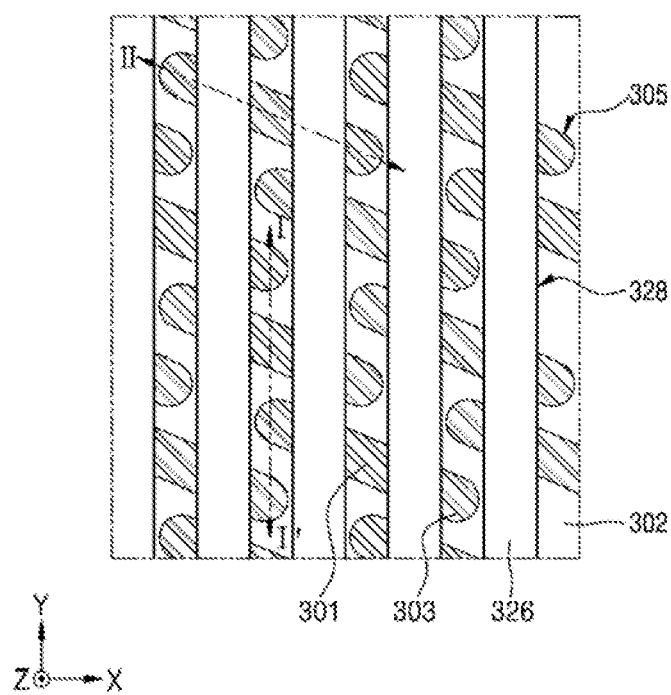
FIG. 13 is a plan view for explaining a method of providing a semiconductor memory device according to an example embodiment of the present inventive concept.
Figure 16:
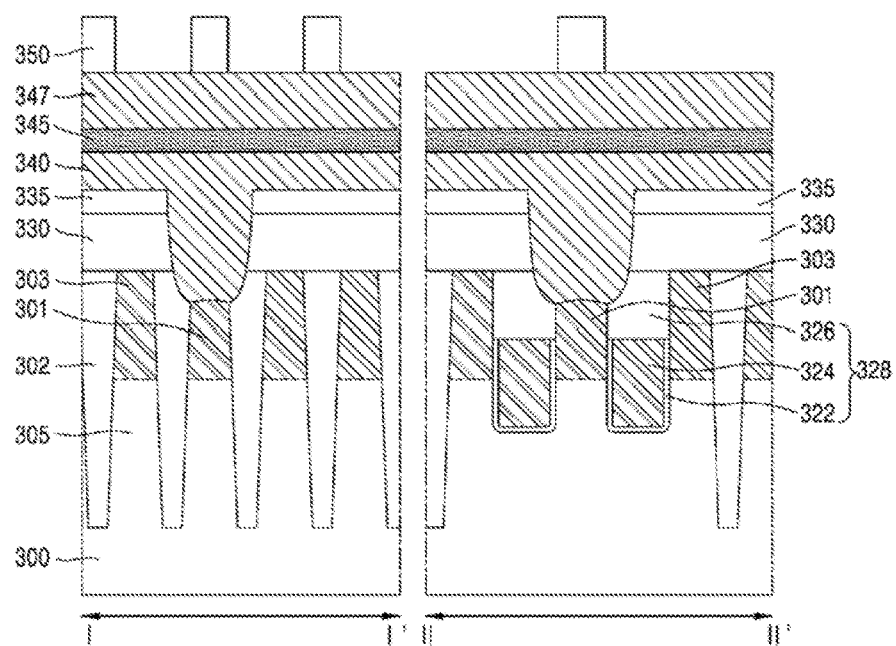
Figure 17:
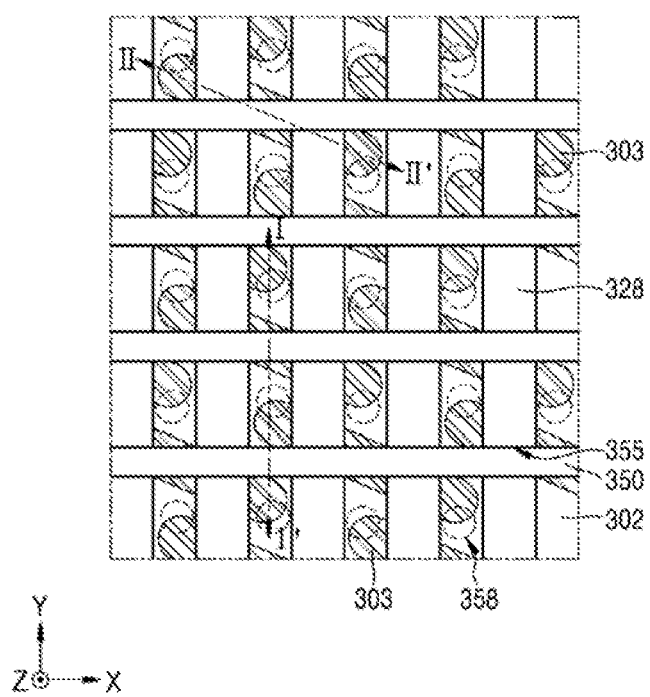
FIG. 17 is a plan view for explaining a method of providing a semiconductor memory device according to an example embodiment of the present inventive concept.

FIGS. 10, 13, and 17 are plan views for explaining a method of manufacturing a semiconductor apparatus 1000 according to an example embodiment of the present inventive concept. FIGS. 11, 12, 14-16, and 18-22 are cross-sectional views for explaining a method of manufacturing a semiconductor apparatus 1000 according to an example embodiment of the present inventive concept. FIGS. 11, 12, 14-16, and 18-22 are cross-sectional views taken along lines I-I' and I-II' of the corresponding plan views including FIGS. 10, 13, and 17.

In an example embodiment of the present inventive concept, FIGS. 10 to 22 illustrate a method of manufacturing a dynamic random-access memory (DRAM) apparatus having a buried cell array transistor (BCAT) structure.

Figure 11:
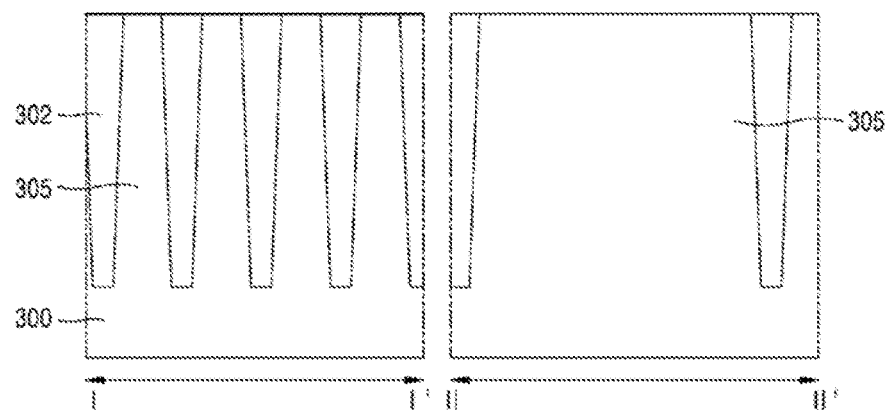
FIGS. 11 and 12 are cross-sectional views for explaining a method of providing a semiconductor memory device according to an example embodiment of the present inventive concept.

Referring to FIGS. 10 and 11, active patterns 305 may be defined by forming a device isolation film 302 on a substrate 300.

The substrate 300 may include a group IV semiconductor and/or a III-V compound semiconductor. The substrate 300 may include a group IV semiconductor such as, for example, silicon (Si), germanium (Ge), or silicon-germanium (SiGe), or a group III-V compound semiconductor such as, for example, gallium phosphide (GaP), gallium arsenide (GaAs), or gallium antimonide (GaSb). In an example embodiment of the present inventive concept, the substrate 300 may be a silicon-on-insulator (SOI) substrate or a germanium-on-insulator (GOI) substrate.

In an example embodiment of the present inventive concept, the device isolation film 302 and the active patterns 305 may be formed by a shallow trench isolation (STI) process. In an example embodiment of the present inventive concept, a device isolation trench may be formed by removing an upper portion of the substrate 300 through an anisotropic etching process, and then an insulating film including silicon oxide ($SiO_2$) may be sufficiently provided to fill the device isolation trench. Next, the device isolation film 302 may be formed by planarizing a top surface of the insulating film using a CMP process or the like until top surfaces of the active patterns 305 are exposed.

As the device isolation film 302 is formed, the plurality of active patterns 305 that are defined by the device isolation film 302 to be spaced apart from one another may be formed. As shown in FIG. 10, each of the active patterns 305 may extend in a first direction (e.g., an X direction) or a second direction (e.g., a Y direction) by being inclined by a predetermined angle. The predetermined angle may vary to some degree. In an example embodiment of the present inventive concept, the predetermined angle may range from about 20° to about 80°. Also, the plurality of active patterns 305 may be arranged to be spaced apart from one another in the first and second directions (e.g., the X and Y directions).

Referring to FIG. 12, gate trenches 309 may be formed by etching upper portions of the active patterns 305 and/or the device isolation film 302.

In an example embodiment of the present inventive concept, a hard mask through which top surfaces of the active patterns 305 and the device isolation film 302 are partially exposed may be formed, and the gate trenches 309 may be formed by partially etching the active patterns 305 and the device isolation film 302 using the hard mask as an etch mask. A lithographic process may be used to define the pattern of the hard mask for forming the gate trenches 309.

In an example embodiment of the present inventive concept, the gate trenches 309 may extend in the second direction (e.g., the Y direction) by passing through the upper portions of the active patterns 305 and the device isolation film 302. In an example embodiment of the present inventive concept, the gate trenches 309 may be arranged to be spaced apart from one another in the first direction (e.g., the X direction).

In an example embodiment of the present inventive concept, two gate trenches 309 may be formed for one active pattern 305. A top surface of the one active pattern 305 may be divided by the two gate trenches 309 into a central portion and two peripheral portions.

Figure 14:
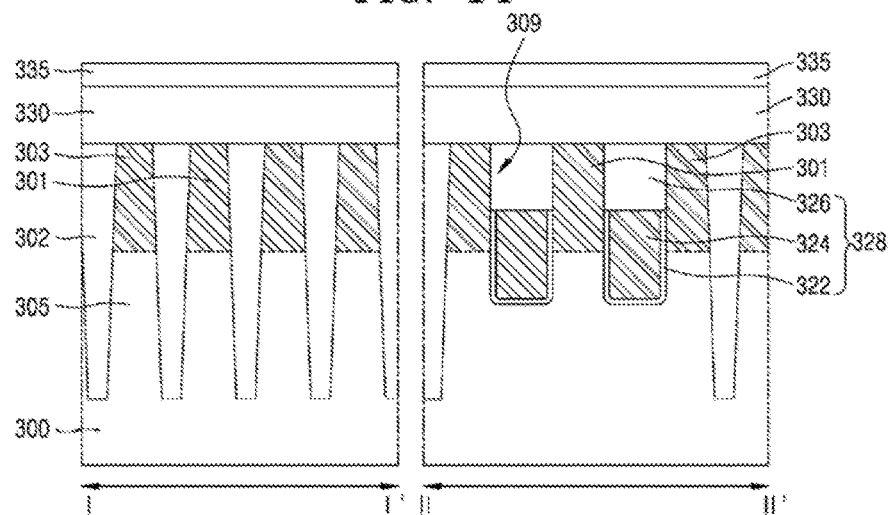
FIGS. 14 to 16 are cross-sectional views for explaining a method of providing a semiconductor memory device according to an example embodiment of the present inventive concept.

Referring to FIGS. 13 and 14, a gate structure 328 that extends by filling the gate trenches 309 may be formed.

In an example embodiment of the present inventive concept, a gate insulating film may be formed by performing thermal oxidation on surfaces of the active patterns 305 exposed through the gate trenches 309 or depositing silicon oxide ($SiO_2$) or metal oxide on the surfaces of the active patterns 305 using, for example, a CVD process.

A gate conductive film that fills remaining portions of the gate trenches 309 may be formed on the gate insulating film. The gate conductive film may be formed of a metal and/or a metal nitride by an ALD process or a sputtering process. Next, the gate conductive film may be planarized until top surfaces of the active patterns 305 are exposed by a CMP process, and parts of the gate insulating film and the gate conductive film formed in the gate trenches 309 may be removed by an etch-back process. Accordingly, a gate insulating pattern 322 and a gate electrode 324 that fill lower portions of the gate trenches 309 may be formed.

A mask film that fills remaining portions of the gate trenches 309 may be formed on the gate insulating pattern 322 and the gate electrode 324, and then a gate mask 326 may be formed by planarizing an upper portion of the mask film until top surfaces of the active patterns 305 are exposed. In an example embodiment of the present inventive concept, the mask film may be formed by a CVD process, and may include silicon nitride ($Si_3N_4$).

Accordingly, the gate structure 328 including the gate insulating pattern 322, the gate electrode 324, and the gate mask 326 that are sequentially stacked in each of the gate trenches 309 may be formed.

As the gate trenches 309 are arranged, a plurality of the gate structures 328 that extend in the second direction (e.g., the Y direction) may be arranged to be spaced apart from one another in the first direction (e.g., the X direction). The gate structures 328 may be buried in the active patterns 305. In an example embodiment of the present inventive concept, upper portions of each of the active patterns 305 may be divided into a central portion between two gate structures 328 and peripheral portions facing the central portion with each of the two gate structures 328 therebetween.

After the gate structures 328 are formed, a first impurity region 301 and second impurity regions 303 may be formed by performing ion implantation on the upper portions of the active pattern 305 adjacent to the gate structures 328. In an example embodiment of the present inventive concept, the first impurity region 301 may be formed at the central portion of the active pattern 305 and the second impurity regions 303 may be formed at the peripheral portions of the active pattern 305.

After the first and second impurity regions 301 and 303 are formed, a capping film 330 that covers the active patterns 305 and the device isolation film 302 may be formed, and a first interlayer insulating film 335 may be formed on the capping film 330. In an example embodiment of the present inventive concept, each of the capping film 330 and the first interlayer insulating film 335 may include, for example, silicon nitride ($Si_3N_4$) and silicon oxide ($SiO_2$), respectively. The capping film 330 may function as an etch stop film for protecting the active patterns 305 or the first and second impurity regions 301 and 303 in subsequent etching processes.

Figure 15:
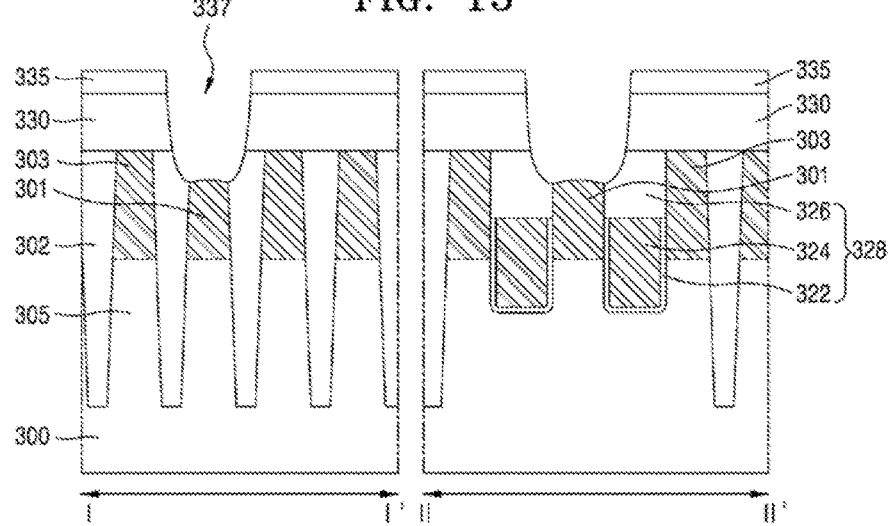

Referring to FIG. 15, a groove 337 through which the first impurity regions 301 are exposed may be formed by sequentially partially etching the first interlayer insulating film 335 and the capping film 330. A plurality of grooves 337 that extend in the first direction (e.g., the X direction) (see FIG. 13) may be formed in the second direction (e.g., the Y direction).

In an example embodiment of the present inventive concept, a part of the first impurity region 301 and a part of the gate mask 326 may also be removed by an etching process for forming the groove 337. Accordingly, a stepped portion may be formed between the first and second impurity regions 301 and 303, thereby preventing a short-circuit or bridge between a conductive line structure 355 (see FIG. 18) and a conductive contact 375 (see FIG. 21) formed in a subsequent process.

Referring to FIG. 16, a first conductive film 340 that fills the grooves 337 may be formed on the first interlayer insulating film 335. A barrier conductive film 345 and a second conductive film 347 may be formed on the first conductive film 340, and a mask pattern 350 may be formed on the second conductive film 347.

In an example embodiment of the present inventive concept, the first conductive film 340 may include, for example, doped polysilicon. In an example embodiment of the present inventive concept, the barrier conductive film 345 may include, for example, metal nitride or metal silicide nitride. In an example embodiment of the present inventive concept, the second conductive film 347 may include a metal material. In an example embodiment of the present inventive concept, each of the first conductive film 340, the barrier conductive film 345, and the second conductive film 347 may be formed by, for example, a sputtering process, a PVD process, or an ALD process.

The mask pattern 350 may include silicon nitride ($Si_3N_4$), and may have a linear shape that extends in the first direction (e.g., the X direction) (see FIG. 17). In an example embodiment of the present inventive concept, a width of the mask pattern 350 (e.g., a width in the second direction) may be less than a width of the groove 337.

Figure 18:
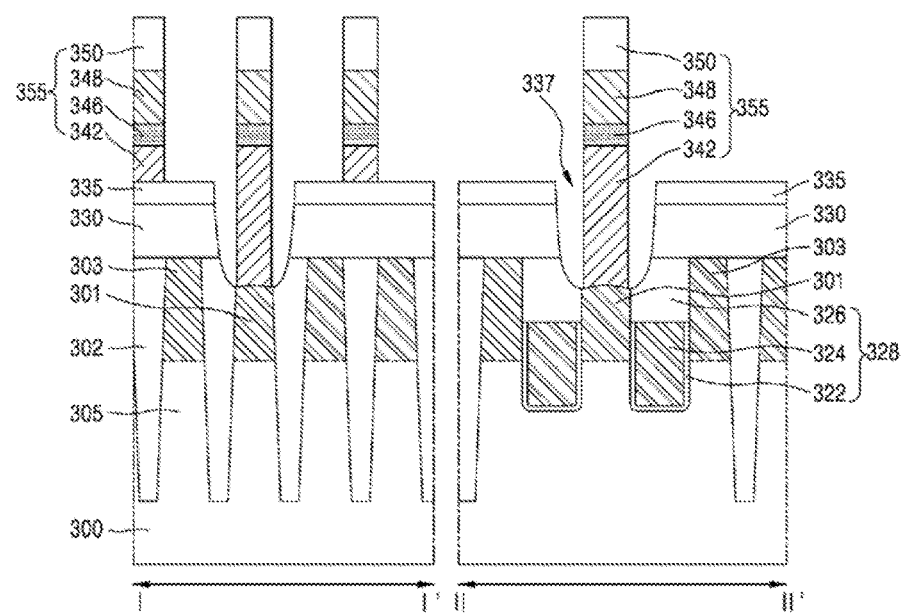
FIGS. 18 to 22 are cross-sectional views for explaining a method of providing a semiconductor memory device according to an example embodiment of the present inventive concept.

Referring to FIGS. 16 to 18, the second conductive film 347, the barrier conductive film 345, and the first conductive film 340 may be etched using the mask pattern 350 as an etch mask. Accordingly, a first conductive pattern 342, a barrier conductive pattern 346, and a second conductive pattern 348 that are sequentially stacked on the first impurity region 301 may be formed. Also, the conductive line structure 355 including the first conductive pattern 342, the barrier conductive pattern 346, the second conductive pattern 348, and the mask pattern 350 and extending in the first direction (e.g., the X direction) on the first impurity region 301 may be formed. In an example embodiment of the present inventive concept, the conductive line structure 355 may function as a bit line. In an example embodiment of the present inventive concept, the conductive line structure 355 may have a width less than that of the groove 337. Accordingly, a sidewall of the conductive line structure 355 may be spaced apart from a sidewall of the groove 337.

Figure 19:
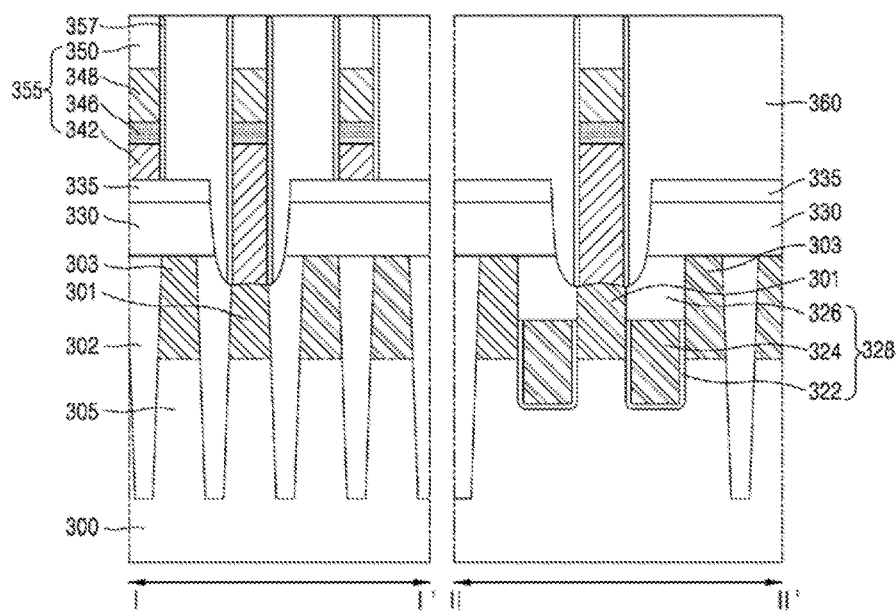

Referring to FIG. 19, a spacer 357 may be formed on the sidewall of the conductive line structure 355. In an example embodiment of the present inventive concept, a spacer film that covers the conductive line structure 355 and includes silicon nitride ($Si_3N_4$) may be formed on the first interlayer insulating film 335, and the spacer 357 may be formed by performing anisotropic etching on the spacer film.

After the spacer 357 is formed, a second interlayer insulating film 360 that covers the conductive line structure 355 may be formed on the first interlayer insulating film 335. In an example embodiment of the present inventive concept, the second interlayer insulating film 360 may fill a remaining portion of the groove 337. The second interlayer insulating film 360 may correspond to the lower insulating film 110 described with reference to FIG. 1.

In an example embodiment of the present inventive concept, a top surface of the mask pattern 350 may be exposed by planarizing a top surface of the second interlayer insulating film 360 using a CMP process. In an example embodiment of the present inventive concept, the second interlayer insulating film 360 may include silicon oxide ($SiO_2$) that is substantially the same as or similar to that of the first interlayer insulating film 335.

Figure 20:
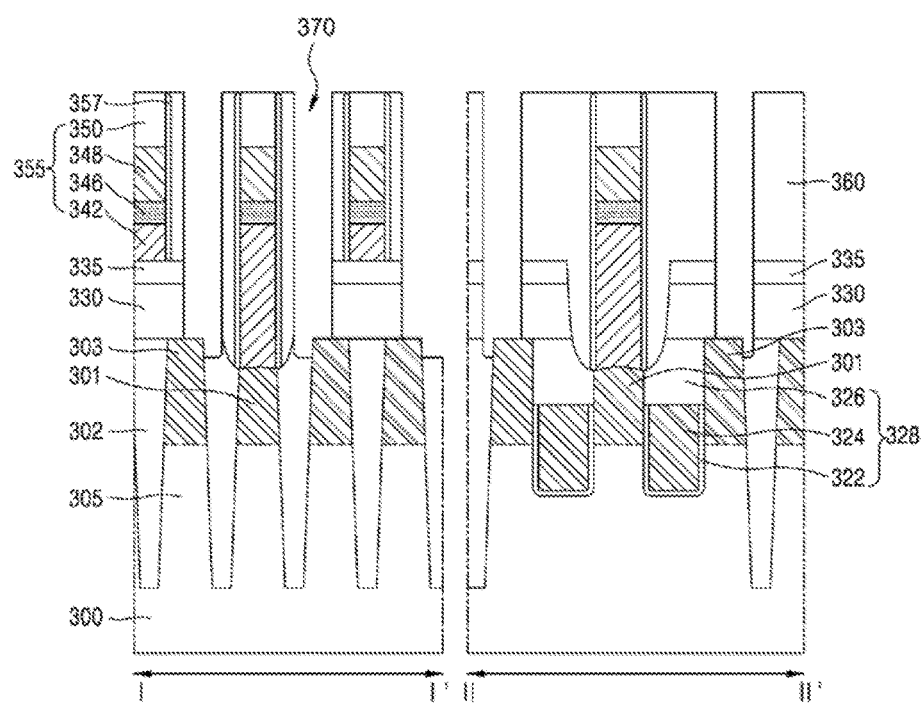

Referring to FIG. 20, a contact hole 370 that passes through the second interlayer insulating film 360, the first interlayer insulating film 335, and the capping film 330 and exposes the second impurity region 303 may be formed. In an example embodiment of the present inventive concept, the contact hole 370 may be formed to correspond to each hole forming region 358 of FIG. 17.

In an example embodiment of the present inventive concept, the contact hole 370 may be formed to correspond to the second impurity region 303. In an example embodiment of the present inventive concept, two contact holes 370 may be formed for one active pattern 305. In an example embodiment of the present inventive concept, the contact hole 370 may be self-aligned with the spacer 357. In this case, a sidewall of the spacer 357 may be exposed through the contact hole 370.

As shown in FIG. 20, a top surface of the second impurity region 303 may be partially exposed through the contact hole 370. Accordingly, an insulating distance between the conductive contact 375 to be formed in the contact hole 370 and the conductive line structure 355 (see FIG. 21) may be secured and parasitic capacitance may be reduced.

Figure 21:
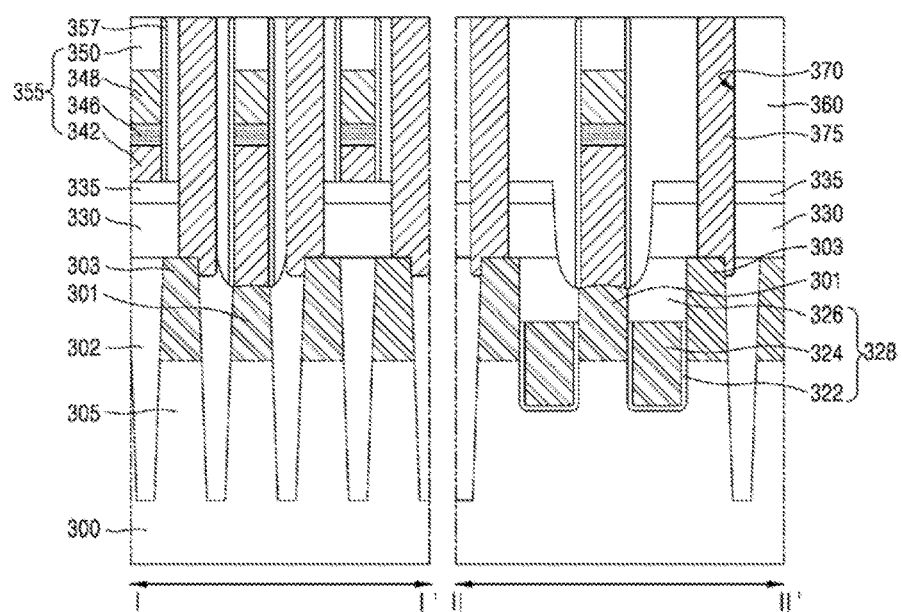

Referring to FIG. 21, the conductive contact 375 that fills the contact hole 370 and contacts or is electrically connected to the second impurity region 303 may be formed.

In an example embodiment of the present inventive concept, a contact conductive film that fills the contact holes 370 may be formed on the second impurity regions 303, the mask patterns 350, and the second interlayer insulating film 360. The contact conductive film that fills the contact holes 370 may also formed on the device isolation film 302. Next, for example, the conductive contact 375 that fills each of the contact holes 370 may be formed by planarizing a top surface of the contact conductive film using a CMP process until a top surface of each of the mask patterns 350 is exposed. The conductive contact 375 may correspond to the lower contact 115 (see FIG. 1). In an example embodiment of the present inventive concept, the contact conductive film may include a metal such as, for example, copper (Cu), tungsten (W), or aluminum (Al), a metal nitride, doped polysilicon, and/or a metal silicide. In an example embodiment of the present inventive concept, the contact conductive film may be formed by, for example, an ALD process, a CVD process, or a sputtering process. In an example embodiment of the present inventive concept, the contact conductive film may be formed by a plating process such as a copper electroplating process. In an example embodiment of the present inventive concept, a barrier conductive film including, for example, titanium (Ti) or titanium nitride (TiN) may be formed on an inner wall of the contact hole 370, and then the contact conductive film may be provided. The barrier conductive film may include a single layer structure or may include a double layer structure including, for example, titanium/titanium nitride (Ti/TiN).

Figure 22:
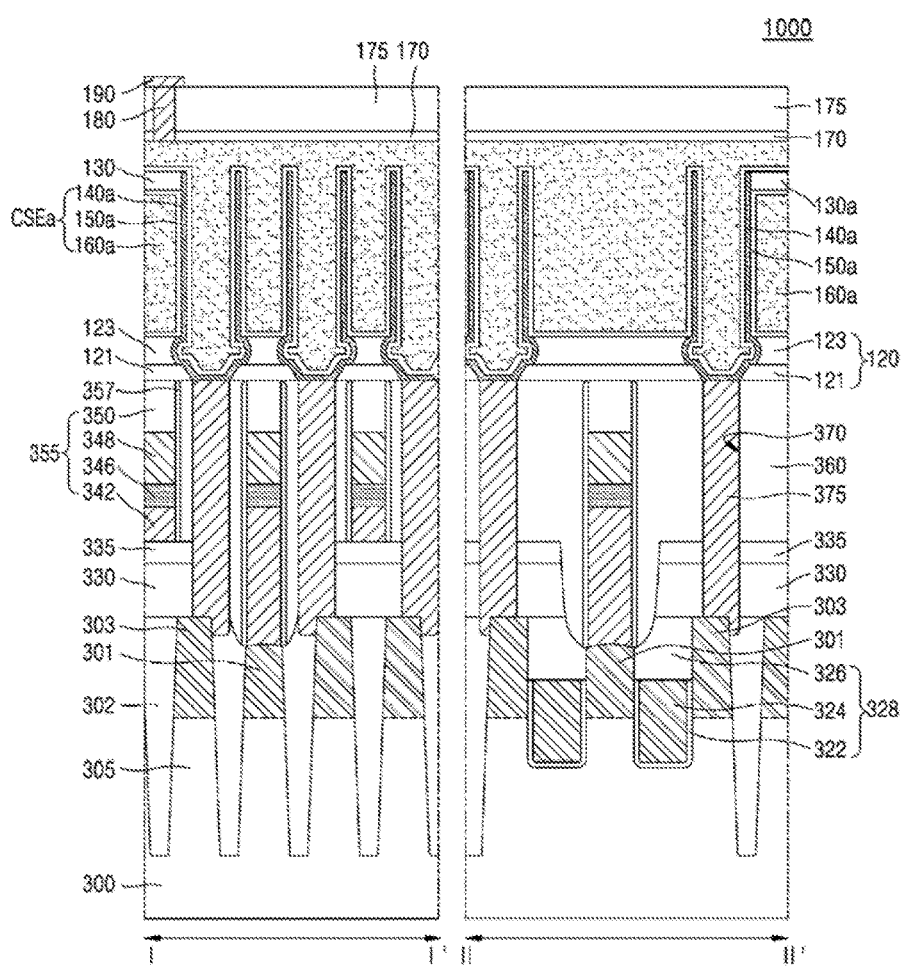

Referring to FIG. 22, in a manner that is substantially the same as that described with reference to FIGS. 2 to 9, the semiconductor memory device 100a of FIG. 1 may be provided on a resultant structure as that described with reference to FIG. 21. Through the above-described processes, the semiconductor apparatus 1000 of FIG. 22 may be provided. The semiconductor apparatus 1000 according to an example embodiment of the present inventive concept may reliably provide the dielectric film 150a, despite a high aspect ratio. Also, a margin between adjacent lower contacts 115 that do not contact lower electrodes 140a may be secured, thereby preventing a short-circuit or bridge between the lower electrodes 140a and the non-contact adjacent lower contacts 115.

While the present inventive concept has been particularly shown and described with reference to a few specific example embodiments, the example embodiments have been used to explain the present inventive concept and should not be construed as limiting thereof. Accordingly, it will be understood by one of ordinary skill in the art that various changes in form and details may be made therein without departing from the spirit and scope of the present inventive concept as defined by the following claims.

What is claimed is:

1. A semiconductor memory device comprising:
    a plurality of lower electrodes located on a substrate and spaced apart from one another;
    a first etch stop pattern located on the substrate and surrounding a lower portion of a sidewall of each of the plurality of lower electrodes; and
    a second etch stop pattern located on the first etch stop pattern,
    wherein a horizontal cross-sectional area of the second etch stop pattern decreases and then increases as the horizontal cross-sectional area of the second etch stop pattern goes away from the substrate in a vertical direction.

2. The semiconductor memory device of claim 1, wherein a horizontal cross-sectional area of the first etch stop pattern varies in the vertical direction.

3. The semiconductor memory device of claim 1, wherein a horizontal cross-sectional area of the first etch stop pattern decreases as the horizontal cross-sectional area of the first etch stop pattern goes away from the substrate in the vertical direction.

4. The semiconductor memory device of claim 1, wherein a minimum horizontal cross-sectional area of the first etch stop pattern is greater than a maximum horizontal cross-sectional area of the second etch stop pattern.

5. The semiconductor memory device of claim 1, wherein a vertical thickness of the first etch stop pattern is less than a vertical thickness of the second etch stop pattern.

6. The semiconductor memory device of claim 1, wherein at least a part of a top surface of the first etch stop pattern contacts the plurality of lower electrodes.

7. A semiconductor memory device comprising:
    a plurality of lower electrodes located on a substrate, spaced apart from one another and having a hollow column shape;
    a first etch stop pattern located on the substrate and surrounding a lower portion of each of the plurality of lower electrodes; and
    a second etch stop pattern located on the first etch stop pattern,
    wherein each of the plurality of lower electrodes comprises:
    a first portion arranged at a first level and defining a first inner space;
    a second portion arranged at a second level higher than the first level and defining a second inner space; and
    a third portion arranged at a third level higher than the second level and defining a third inner space,
    wherein a horizontal width of the second inner space is greater than a horizontal width of the third inner space.

8. The semiconductor memory device of claim 7, wherein a gradient of a cross-sectional profile of the third portion in a vertical direction is greater than a gradient of a cross-sectional profile of the first portion in the vertical direction.

9. The semiconductor memory device of claim 7, wherein the first level is substantially the same as a level of the first etch stop pattern.

10. The semiconductor memory device of claim 7, wherein the second level is substantially the same as a level of the second etch stop pattern.

11. The semiconductor memory device of claim 7, wherein a horizontal cross-sectional area of the first portion decreases as the horizontal cross-sectional area of the first portion goes toward the substrate.

12. The semiconductor memory device of claim 11, further comprising a conductive contact passing through at least a part of the substrate and connected to a bottom surface of the first portion,
    wherein a width of a top surface of the conductive contact is substantially the same as a width of the bottom surface of the first portion.

13. The semiconductor memory device of claim 7, wherein a horizontal cross-sectional area of the second portion increases and then decreases as the horizontal cross-sectional area of the second portion goes away from the substrate.

14. The semiconductor memory device of claim 7, wherein a horizontal cross-sectional area of the third portion is substantially constant.

15. The semiconductor memory device of claim 7, wherein a cross-sectional profile of each of the plurality of lower electrodes in a vertical direction has inflection points at a boundary between the first and second portions and a boundary between the second and third portions.

16. The semiconductor memory device of claim 7, further comprising a dielectric layer conformably formed on the plurality of lower electrodes,
    wherein the dielectric layer has outward protrusions at the second level.

* * * * *